United States Patent [19]

Langner et al.

[11] Patent Number: 5,136,167

[45] Date of Patent: Aug. 4, 1992

[54] ELECTRON BEAM LENS AND DEFLECTION SYSTEM FOR PLURAL-LEVEL TELECENTRIC DEFLECTION

[75] Inventors: Guenther O. Langner, Poughkeepsie; Paul F. Petric, Brewster, both of N.Y.

[73] Assignee: International Business Machines Corporation, Armonk, N.Y.

[21] Appl. No.: 638,241

[22] Filed: Jan. 7, 1991

[51] Int. Cl.$^5$ .......................... H01J 37/30; H01J 37/10
[52] U.S. Cl. .................. 250/396 R; 250/398; 250/492.2
[58] Field of Search .................. 250/492.2, 398, 396 R

[56] References Cited

U.S. PATENT DOCUMENTS

| | | | |
|---|---|---|---|
| 4,140,913 | 2/1979 | Anger et al. | 250/398 |
| 4,198,569 | 4/1980 | Takayama | 250/492.2 |
| 4,544,846 | 10/1985 | Langner et al. | 250/396 ML |
| 4,859,856 | 8/1989 | Groves et al. | 250/398 |
| 4,945,246 | 7/1990 | Davis et al. | 250/398 |

*Primary Examiner*—Bruce C. Anderson
*Attorney, Agent, or Firm*—Whitham & Marhoefer

[57] ABSTRACT

A charged particle beam deflection system provides a three or more level charged particle beam deflection arrangement and is therefore capable of extremely high speed and positional accuracy. The system preferably employs a major/minor magnetic deflection arrangement as well as orthogonal electrostatic deflectors at a level of speed and positional accuracy and which minimizes the need for dynamic correction to achieve high linearity and positioning accuracy at extremely low aberration levels. The system can also be made relatively noise insensitive by providing one or more split deflectors which are also useful in providing increased speed and adjustment of radial and azimuthal telecentricity. The use of a transfer lens allows the cluster and subfield deflectors to be optimally placed to exploit different forms of LAD to obtain telecentricity at all levels of the deflection hierarchy. The use of such lens assisted deflection allows the electron optical system and drivers therefor to be minimized in number or enabled noise to be reduced and adjustments of telecentricity to be made without increase of complexity over the prior art. By employing the deflection arrangement of the present invention in electron beam lithography apparatus, the throughput of such apparatus can be greatly improved.

30 Claims, 5 Drawing Sheets

ELECTRON BEAM LENS AND DEFLECTION SYSTEM FOR PLURAL-LEVEL TELECENTRIC DEFLECTION

DESCRIPTION

BACKGROUND OF THE INVENTION

1. Field of the Invention

The present invention generally relates to deflection systems for charged particle beams and, more particularly, to systems for deflecting electron beams at high speed and positional accuracy, especially in electron beam lithography apparatus.

2. Description of the Prior Art

Many divergent types of devices have been known in the past which rely on the ability to deflect a charged particle beam at high speed and with positional precision. Examples of such devices include oscilloscopes, television and other cathode ray tube applications, electron microscopes, ink-jet printers and electron beam lithography apparatus. Among these devices, electron beam lithography has become widely used in the processes associated with the fabrication of integrated circuits, such as the fabrication of masks for making such integrated circuits as well as the devices, themselves, through a process known as direct write lithography. With increasing degrees of integration density of integrated circuits, the requirements for speed and positional precision of electron beam deflection in electron beam lithography has similarly increased.

Economies to be derived from fabrication of integrated circuits on large wafers and the desirability of minimizing wafer repositioning during the electron beam lithography process require that electron beam deflection arrangements have a large range. The large range is also necessary to permit the electron beam to reach registration marks, placed at the four corners of the exposure area, without repositioning of the wafer.

The requirement for large range imposes certain performance constraints on the electron beam deflection system which are inconsistent with high speed and positional accuracy. For instance, if electrostatic deflection is used to obtain high speed, large range cannot be obtained without resulting in unacceptable degrees of various aberrations of the image formed by the beam cross-section. As is known, aberrations will occur with both electrostatic and magnetic deflection and will generally vary with the deflection angle. However, for a given angle of deflection, magnetic deflection will produce much smaller degrees of aberration than electrostatic deflection for practical deflection sensitivities. If magnetic deflection is used to achieve reduced aberration, the driver circuits capable of providing a large deflection range characteristically exhibit a long settling time and cannot accommodate high speed without being subject to and/or causing unacceptable levels of noise. If bandwidth of the driver circuits is reduced to reduce noise and accommodate long settling times, beam relocation speed and, hence, throughput of exposed devices is reduced, raising the cost of the process. Even when major/minor or other multichannel deflection arrangements are used to separate the high speed and large range requirements in magnetic deflection arrangements, inductive interactions often result in positioning times for high accuracy (e.g. settling times) which are more characteristic of the low speed/large range major driver than the high speed minor driver. U.S. patent application Ser. No. 07/607,196, filed Oct. 31, 1990, by Charles A. Gaston et al. entitled Compensation of Mutual Inductance in Multi-Channel Deflection Yokes, assigned to the assignee of the present invention, provides a possible solution to the problems associated with inductive coupling of driver circuits in multi-channel arrangements. This solution is most easily implemented in a deflection arrangement having two levels of magnetic deflection. The disparity between required deflection range and required deflection resolution, however, tends to make the provision of more than two channels preferable. While the invention described in the above-noted application, which is hereby fully incorporated by reference, is applicable to systems of any number of channels, such an implementation becomes much more complex as the number of channels is increased and adjustment for exact inductive coupling compensation becomes difficult.

Moreover, in major/minor deflection arrangements or other multichannel arrangements providing a hierarchy among deflection speeds and ranges, a practical limit to the number of channels or levels in the hierarchy is rapidly reached. A particular and salient limit imposed on the number of levels is the physical length of the electron optical column and the ability to fit magnetic deflection coils or electrostatic deflection plates into that length at locations which are consistent with all other requirements, dimensions and elements of the electron optical design of the deflection arrangement. This latter physical constraint is particularly critical and limiting in electron beam deflection arrangements which provide a constant beam landing angle, preferably normal to the target plane, over the entire deflection field.

Telecentric deflection is particularly desirable in electron beam lithography since the exposure target may not have a perfectly planar exposure surface which is consistently normal to the incident beam. If the electron beam impinges on the target surface at an angle that varies with the amount of deflection, any surface irregularity or deviation from the design target plane will cause a dimensional distortion in the exposed pattern on the target. However, if such imperfections exist in the target, distortion of the exposure pattern will be minimized or eliminated if the beam is kept parallel to itself when under the influence of the deflection arrangements employed (e.g. the deflected beam path is kept parallel to the undeflected beam path). Therefore, it is desirable that the deflection arrangement provide that the electron beam always be exactly parallel to itself (e.g. parallel or at a consistent angle to the electron optical axis) over the entire deflection range. This property is commonly referred to as telecentricity and guarantees that the angle of incidence of the beam impingement on the target stays the same throughout the field for a planar surface. It should be noted that the property of telecentricity is distinct from the angle of impingement on the target being exactly or ideally normal to the target.

The provision of telecentricity can theoretically be achieved by placement of the major deflector at the front focal plane of the projection lens. However, this cannot be achieved in practice because of the finite physical sizes of the projection lens and the major deflector. Since a deflector cannot be made infinitely small, only a compromise solution can be achieved, at best. Therefore, providing a reasonably close approximation of telecentricity for a single coordinate deflection direction has required two electrostatic or magnetic deflectors at a distance from the focal plane of the projection lens: the first to provide deflection having a radial component with respect to the axis of electron beam optical column and a second, driven synchronously with the first, to remove the radial component and return the beam to a direction which appears to emerge from a point generally on the axis and positioned relative to the lens to optimize telecentricity. It must be realized that any deflection of the beam, whether by a deflection arrangement or a lens, presents a disruption of telecentricity which, while such disruption can be minimized, must be traded off with the other aberrations which must also be simultaneously minimized in the design.

To achieve telecentricity while minimizing deflection aberration, a variable axis immersion lens (VAIL) has been developed in which the axis of the projection lens can be maintained substantially in coincidence with the telecentrically deflected beam over the entire deflection range. This lens and its use in and electron beam deflection arrangement are disclosed in greater detail in U.S. Pat. No. 4,544,846, to Langner et al and the same is hereby fully incorporated by reference. In summary, however, it is sufficient to indicate that since the axis of the lens can be shifted to coincide with the telecentrically deflected beam, the beam always arrives at the lens along the axis of the lens and no deflection of the beam occurs. Since no deflection of the beam is produced by the lens, no disruption of telecentricity occurs and, in fact, the optimization of the beam imaging is separated from optimization of the beam deflection.

Application of such a lens to a two channel hierarchical deflection arrangement including both magnetic and electrostatic deflectors is disclosed in detail in U.S. Pat. No. 4,859,856, to Groves et al, which is also fully incorporated by reference. As disclosed therein, disturbance of telecentricity can be avoided while limiting electrostatic deflection to very small deflections at very high speed. Typically, increases in speed imply a reduction is positional accuracy. However positional accuracy can be maintained, consistent with high speed, by limiting the deflection range. Therefore, optimization of high speed and positional accuracy can best be achieved by dividing the deflection requirements between a plurality of hierarchical levels of deflection. The arrangement of Groves, by minimizing aberrations and avoiding additional blurring of the beam, maintains a beam edge acuity of 0.1 microns. This corresponds to a resolution (range of 10 mm divided by beam edge acuity) of 100,000 lines. (It should be realized, however, that this resolution figure is an indication of the number of pixels which can be resolved in the deflection field rather than the number of pattern features which can be produced.) By comparison, the resolution of a good electron microscope is typically about 1000 lines or two orders of magnitude less.

A principal function of the projection lens in the prior art is to bring the electron beam into focus at the target surface. However, the focus and astigmatism of the beam is also affected by deflection. As the beam is deflected over its deflection range, it undergoes effects which degrade its sharpness and quality. These are known collectively as deflection aberrations. Two such deflection aberrations which are generally correctable are focus and stigmation (astigmatism).

However, as with other aspects of any deflection system design, the effectiveness of focus and astigmatism correction depends, in large degree on the ability to ideally locate the coils used for such corrections. For instance, focus and astigmatism correction cannot be effectively achieved after deflection since the correction will then introduce a consequent error in the deflection.

The VAIL system, as applied to shaped beam lithography, suffers from the problem that the focus and stigmation correction elements cannot be placed at the best location for the performance of this function since no image of the source is formed above the collimator lens and deflectors. Any system must, of course be physically realizable and a need has existed for an electron optical deflection geometry and arrangement in which more than two levels of deflection hierarchy can be accommodated for reasons of speed and accuracy while maintaining telecentricity. Likewise, a further need exists concurrently with the above needs to avoid the interaction between deflection and correction of astigmatism and focus of the electron beam in order to fully assure that telecentric deflection will be maintained.

SUMMARY OF THE INVENTION

It is therefore an object of the present invention to provide an electron optical deflection arrangement in which all three of the above needs are simultaneously met.

It is further object of the invention to provide a physically realizable multi-channel telecentric electron optical deflection arrangement having more than two hierarchical deflection levels.

It is yet another object of the invention to provide an electron optical deflection system in which a static electron optical element is utilized as a deflector of one or more telecentric deflector pairs to eliminate both speed constraints and reduce space constraints along the axis of the electron optical column while eliminating the need for additional deflection elements.

It is another further object of the invention to provide an electron optical deflection system in which a static electron optical element is utilized to provide a means of deflection imaging which attenuates deflector drive noise and utilize space along the electron optical column axis to decrease deflection angles in order to increase the sensitivity of the higher speed deflectors of a hierarchical multi-channel deflection system.

It is yet another further object of the invention to provide an electron optical deflection system in which a means is provided to adjust azimuthal telecentricity while attenuating drive noise and reducing deflection driver circuit load to increase speed.

In order to accomplish the above and other objects of the invention, a charged particle beam deflection apparatus is provided in accordance with one aspect of the invention, including a transfer lens means for imaging a demagnified spot image at a predetermined plane, a collimator lens having a back focal plane coincident with the predetermined plane, and at least one deflector means having a virtual deflection center located between the collimator lens and the transfer lens means.

In accordance with another aspect of the invention, a charged particle beam deflection apparatus is provided having a first lens means for imaging a demagnified spot image at a predetermined plane and at least one second lens means wherein said first lens means includes means for at least focussing an image formed by said at least one second lens means.

In accordance with a further aspect of the invention, a method of deflecting a charged particle is provided including the step of deflecting the path of a charged particle by static operation of a collimator lens means and a projection lens means.

In accordance with yet another aspect of the invention, an electron beam lithography method and apparatus are provided incorporating the above features of the invention.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
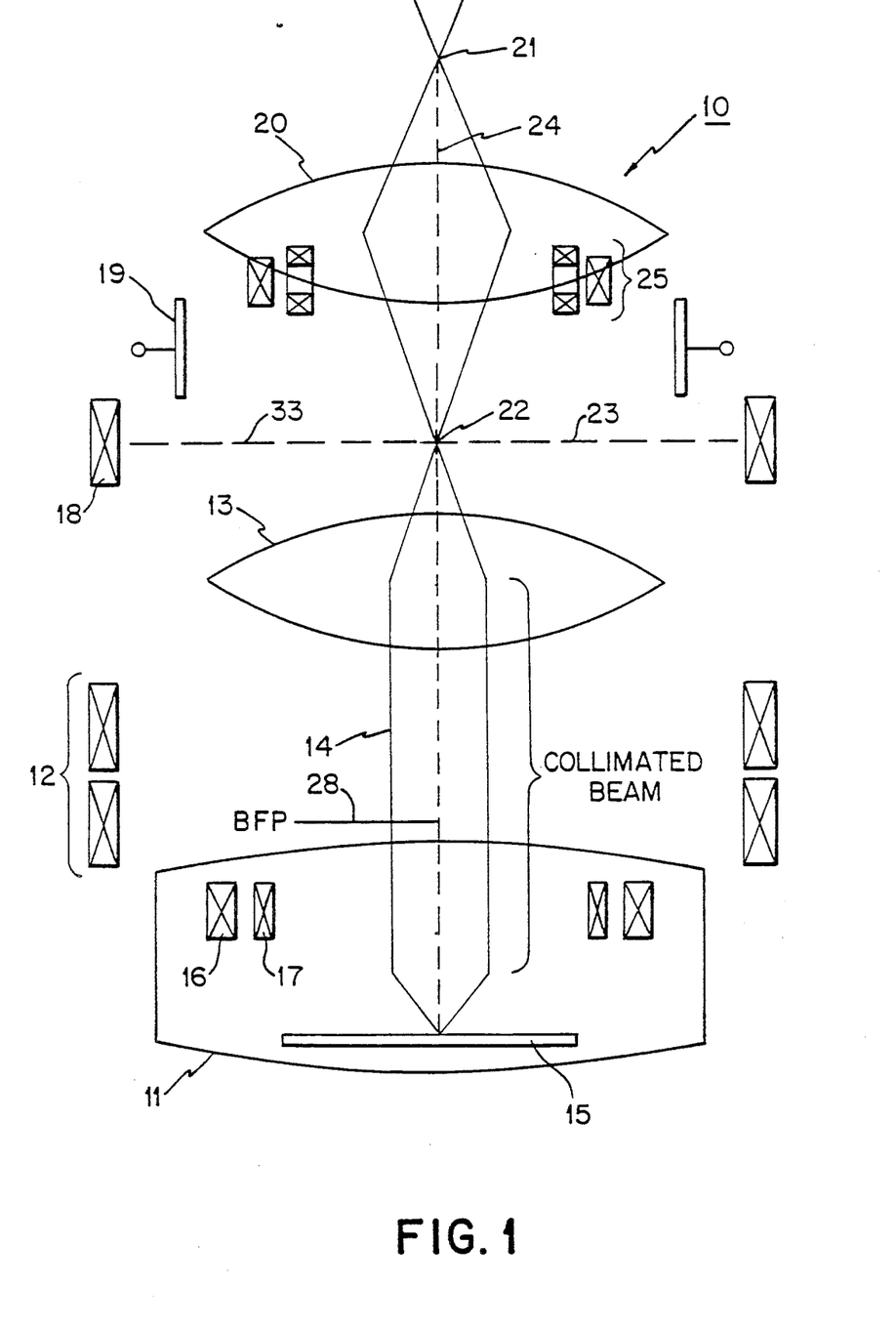
FIG. 1 is a diagram of the electron optical deflection system according to a preferred embodiment of the present invention.

Referring now to the drawings, and more particularly to FIG. 1, there is shown a schematic diagram of the layout of an array 10 of electron optical elements in accordance with the invention. The VAIL projection lens 11, major magnetic field deflectors 12, and collimator lens 13 are also used in the existing VAIL deflection system to project and position an electron beam 14 onto target 15. The field deflectors 12 are provided in two parts just above the projection lens 11 to obtain telecentric major deflection. A collimator lens 13 is provided above the field deflector to collimate the electron flow before it enters the field deflector 12. As is well known in the art, a collimator lens will cause electrons travelling along a line from the intersection of the axis of the lens and its back focal plane to assume a path, upon leaving the lens, which will be parallel to the optical axis of the lens. However, such lenses also have the property that electrons travelling along paths intersecting each other at the back focal plane at a point other than the axis will be caused to assume parallel paths, upon leaving the lens, which are not necessarily parallel to the optical axis. This latter function is particularly important to the invention.

The projection lens 11 performs a substantially complementary function to the collimating lens, to focus electrons following parallel paths on a single point of target 15. In this sense, the collimator lens 13 and the projection lens 11 can be viewed as two parts of a single lens focussing an image of the object at the back focal plane of the collimator lens 13 at the front focal plane of the projection lens 11 which is coincident with the target plane 15. It should, accordingly, be understood that the collimator lens and the projection lens are also similar in their operation in that an object or image is at the focal plane of each of these lenses.

Deflection by the field deflector 12, which is preferably a magnetic deflector does not disturb the collimation of the beam since the angle of deflection of any electron will be a constant angular change from the initial angle of the electron path. Therefore, electrons following parallel paths upon entry into the field deflector 12 will also emerge from deflector 12 along parallel paths and will be focussed on the same spot by the projection lens 11 due to the action of the correction yoke or yokes 16, 17 included therein. The correction yoke is so named because it corrects coincident with the beam location, in accordance with the VAIL concept and to avoid variance from telecentricity. The correction yoke is preferably divided into a major correction yoke 16 and a minor correction yoke 17 for reasons which will be explained below. These yokes are preferably concentric and located at the same position along the electron optical axis 34.

In contrast to the VAIL system, the present invention additionally provides a transfer lens 20 or its functional equivalent, above a single cluster or minor magnetic deflector. In typical deflection systems, the demagnification lens will usually have a focal length which is relatively short. Since the demagnification lens and coil, itself is fairly large, the demagnified spot image is typically formed within the demagnification lens. The transfer lens 20, according to a preferred embodiment of the invention, has a much longer focal length. In some applications, it is also possible to design a system in which the demagnification lens= has a focal length which is nearly as long as the transfer lens in the preferred embodiment. In such a case, the demagnified spot image would be accessible and such a demagnification lens would perform the equivalent function of the transfer lens of the preferred embodiment. The transfer lens 20 or functionally equivalent structure has several functions in the deflection system of the present invention.

First, the transfer lens functions to transfer the demagnified spot image 21 from the demagnification lenses (not shown) to a position located in the back focal plane of the collimator lens 13, indicated, in the undeflected location of FIG. 1, by cross-point 22. This is required since the region of the demagnified spot is typically, as pointed out above, inaccessible for the optimum location of other optical elements. Due to the function of the transfer lens 20, the minor deflection yoke (e.g. the cluster deflector 18) can be located such that the transferred spot image 22 will also coincide with the location of the virtual deflection center of the minor deflection yoke in the preferred embodiment of the invention. The result of this feature will be explained in greater detail below. It should be noted, however, that this positioning is made possible by the transfer lens which allows the structure for forming the demagnified spot to be located elsewhere.

Second, the transfer lens 20 provides a high DC magnetic bias field region in which to locate the dynamic focus and dynamic stigmator corrector coils 25. This provides a nearly linear dynamic correction to be required by these optical elements. In addition to providing a highly linear correction for the focus and astigmatism of the beam, the location of these corrections ahead of all deflection elements or regions ensures that no error in deflected position is introduced by the focus or astigmatism corrections.

Third, since the transfer lens 20 provides focussing at the back focal plane of the collimator lens 13, the transfer lens also provides a means of final beam focussing at the target plane without disruption of the collimator or projection lens setups.

Fourth, the transfer lens 20 provides space for locating the dynamic focus and dynamic stigmator magnetic correction coils 25 at a location which is optically preferred. In the preferred embodiment utilizing shaping optics, the invention will provide a source image between the transfer and collimator lenses for the correct optical positioning of the dynamic corrections for focus and astigmatism prior to deflection of the beam.

The beam trace indicated in FIG. 1 is undeflected and therefore coincident with optical axis 24. The uppermost crossing point 21 is at the location of the demagnified image. The next crossing point 22 is in the back focal plane 33 of the collimator lens 13 and the deflection center 30 of the minor or cluster deflector 18, coincident therewith. The final crossing point of the beam is at the target plane 15 where it is focussed by the projection lens.

The cluster deflector is the level of the deflection hierarchy below the major deflector, meaning that it is able to produce a smaller range of deflection than the major deflector but can produce a higher speed deflection than the major deflector. The third level of the deflection hierarchy is preferably provided by an electrostatic subfield deflector 19 since such electrostatic deflectors are capable of extremely high speed deflection and have characteristically low settling times. The geometry of the invention, and specifically the length along the axis of the electron optical column provided by the transfer lens permits the deflection angles and, hence, the degree of various aberrations of the electrostatic deflection system, to be kept low.

Figure 2:
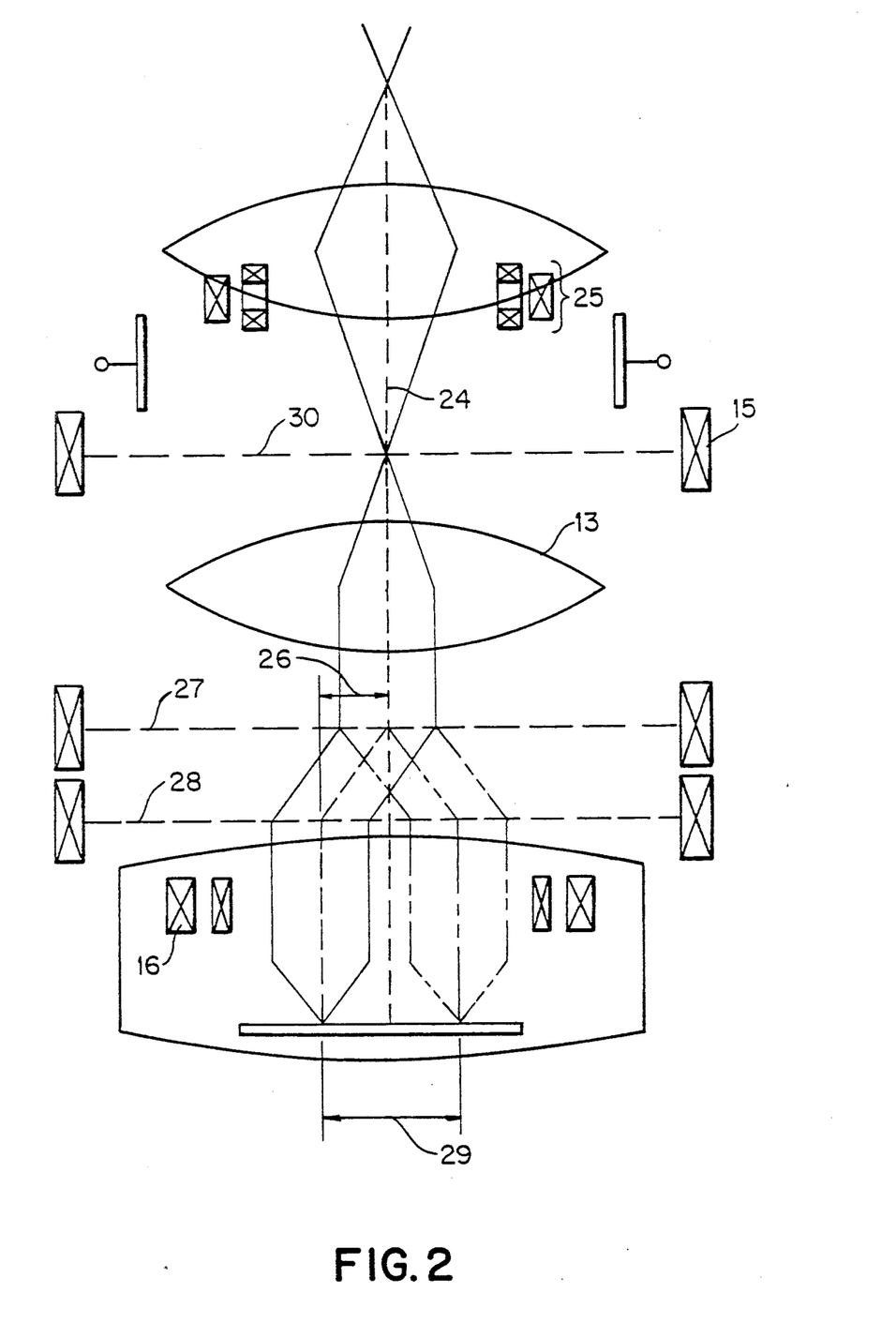
FIG. 2 is a diagram of the electron optical deflection system of FIG. 1 showing deflection caused by the major magnetic deflector, alone.

Referring now to FIGS. 2-5, the operation and other features of the invention will be explained. With particular reference to FIG. 2, the same schematic illustration of the elements of the invention are shown but with the electron beam deflected by the major deflector 12. The deflectors 12 used for this telecentric deflection are cross-hatched in this illustration. This deflection is identical with a magnetic deflection in the present VAIL system except for the position of the dynamic correctors 25 which have been repositioned just below the mid-plane of the transfer lens 20. This is also the location of the image of the electron source (not shown, e.g. the electron gun, as distinguished from the demagnified spot image). The deflection centers of the field deflectors are indicated by dotted lines 27, 28.

It is to be understood that the electron beam deflection is not angular, as depicted but will follow a curved path for each of the deflectors. The virtual deflection centers depicted by the intersection of dotted lines are those points where lines which are tangent to the electron path outside the influence of the deflector field would intersect at the optical axis.

It should also be noted that in some designs, the required range may not be so large as to require a separate field deflector and the field deflection yoke and drivers therefor can be omitted altogether, resulting in a two stage deflection arrangement. In principle, the invention is also applicable to a single stage deflection arrangement. However, in a deflection arrangement having only a single deflection stage, space is more readily available and the need for the provision of additional space, a particular advantage of the present invention, is accordingly reduced.

The shift of the lens axis produced by the major correction yoke 16 of the VAIL lens is illustrated at 26. The range or field 29 of the deflection system, provided by the major or field deflector, is therefore seen to be large resulting in minimization of the number of target relocations required in the electron beam lithography process for a given size of target.

Figure 3:
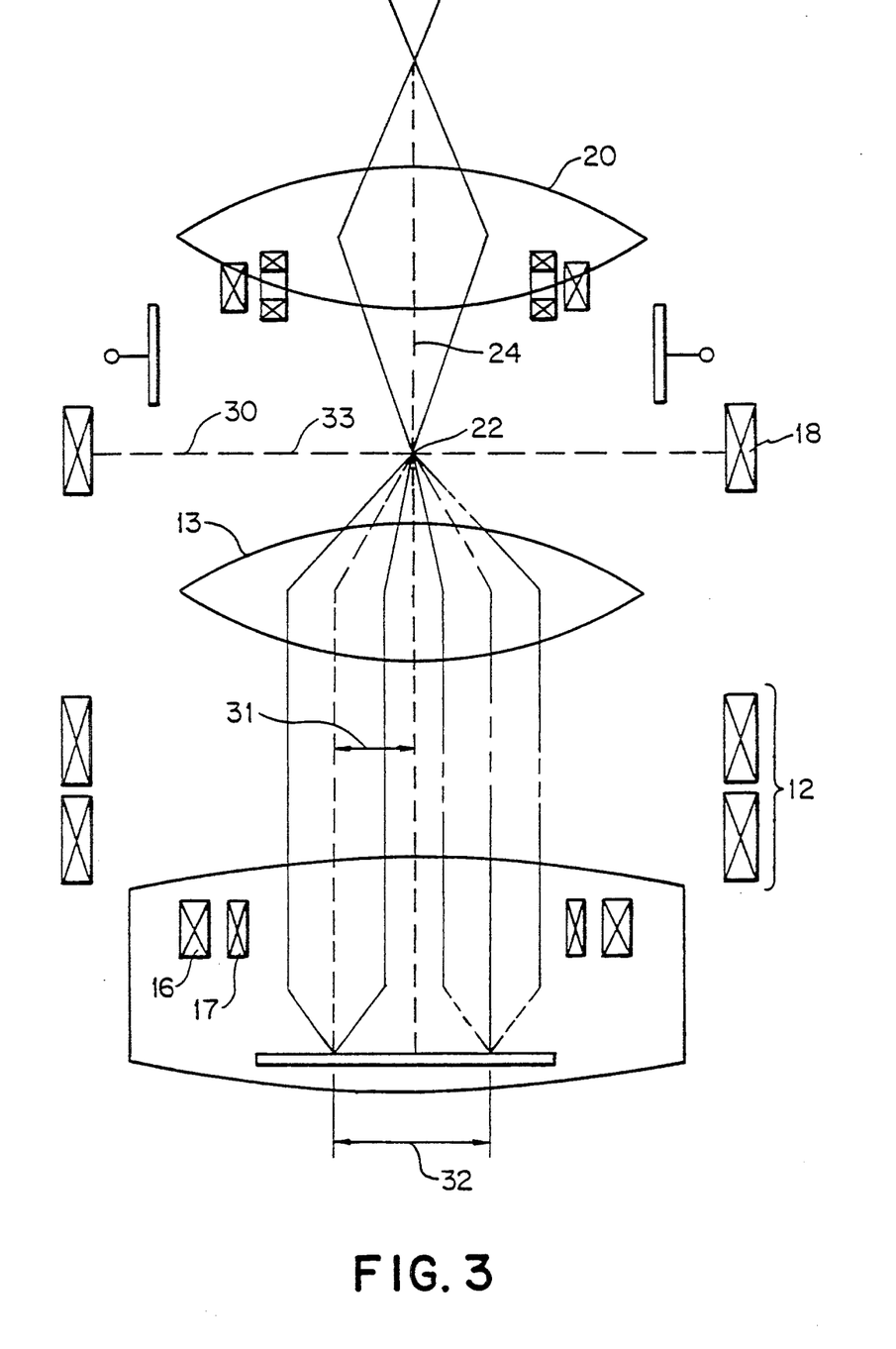
FIG. 3 is a diagram of the electron optical deflection system of FIG. 1 showing deflection caused by the minor magnetic deflector, alone.

Deflection of the beam by the cluster, or minor, deflector is illustrated in FIG. 3. Again, the yokes used to produce this deflection are cross-hatched. In this level of deflection, the collimator lens 13 is used as though it were a second deflector of a pair of deflectors for providing telecentric deflection. Since the beam image point 22 is located at both the back focal plane of the collimator lens and at the plane of the virtual deflection center 30 of the cluster deflector 18, the collimator lens 13 (assuming that it is a sufficiently good lens) will still collimate the beam even though it reaches the collimator lens at a different angle. Therefore, the collimator lens will ensure that deflection telecentricity is maintained. Using the collimator lens as the second deflection element will be referenced hereinafter as lens assisted deflection (LAD).

Since the beam exiting from the collimator lens 13 is parallel to the electron optical axis of the system, it will appear the same to the projection lens as the major deflection by major deflector 12 of FIG. 2. However, the axis of the VAIL lens must be shifted by the distance corresponding to the minor or cluster deflection as indicated at 31. This component of axis shift is done by appropriate excitation of minor correction yoke 17 which is preferably positioned to be coplanar and coaxial with major correction yoke 16. Such a configuration allows the minor axis shift component to be superimposed on the major axis correction component, if any. The concept of providing coincident separate structures for major and minor lens axis correction is referred to as dual-VAIL.

The range corresponding to maximum cluster deflection is shown at 32. Depending on the specific requirements of the desired application, the proportionality of the cluster range to the field range of about 20 to 40 provides a desirable division between ranges of the deflection hierarchy in consideration of noise, speed, settling time, deflection aberration and other design factors, such as the typical size of chips or mask sections to be manufactured using this process and minimization of the number of major deflection beam relocations. If the cluster deflection range is kept small enough, the need for dynamic correction can be made marginal or very small, limiting the need for dynamic correction to the major or field deflection arrangement.

Figure 4:
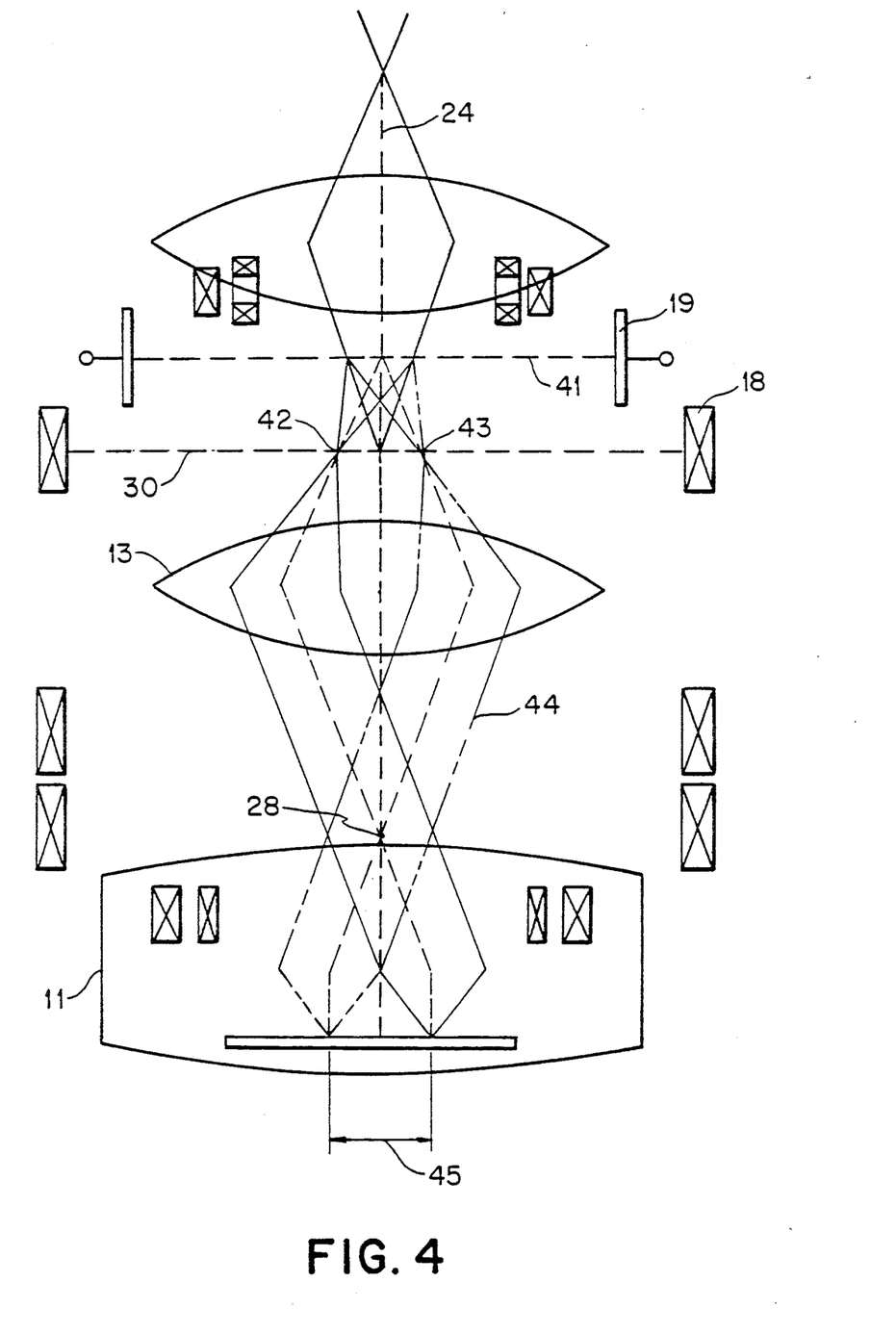
FIG. 4 is a diagram of the electron optical deflection system of FIG. 1 showing deflection caused by the electrostatic subfield deflector, alone.

Referring now to FIG. 4, subfield deflection in accordance with the invention is illustrated. The LAD concept can again be used for this level of the deflection hierarchy but in a different form. Specifically, in accordance with a preferred embodiment of the invention, the subfield deflection is performed electrostatically for extremely high speed. Although the electrostatic deflector 19 could theoretically be placed within the cluster deflector 18, at the back focal plane of the collimator lens, it is deemed preferable to place the deflection plates closer to the transfer lens to increase the distance to the back focal plane 33 of the collimator lens 13, coincident with the cluster deflection center 30. This allows the electrostatic deflection range to be increased at very low deflection angles in order to reduce aberrations of the subfield deflector 19. This distance also permits designs in which the electrostatic deflectors 19 can be placed outside the region of influence of the cluster deflectors 18, thus reducing the problem of eddy currents being generated in the deflection plates. By placing the deflection center 41 of the subfield deflector 19 ahead of the deflection center 30 of the cluster deflector, the crossing point 22 of the electron beam, as shown in FIG. 1, is brought to an off-axis location such as 42 or 43 which is, nevertheless, still in the back focal plane 33 of the collimator lens 13. This off-axis location and the subfield deflection angle causes the collimator to deflect the beam back toward the electron optical axis 24 of the system. The subfield deflector 19 is positioned with respect to the collimator lens 13 such that the virtual deflection center of the subfield deflector is positioned at a point relative to the collimator lens 13 which is conjugate to the back focal plane of the projection lens 11. This spacing of the collimator lens from the back focal plane 28 of the projection lens 11 and the spacing of the subfield deflector 19 from the back focal plane 33 of the collimator lens 13 are thus chosen such that the deflected beam from the off-axis location is deflected back to cross the axis 24 of the electron optical column at the back focal plane 28 of the projection lens 11. This effectively causes the projection lens to be imaged at infinity for the subfield deflection. Since the projection lens has the same properties as the collimator lens, as noted above, the projection lens will return the beam to a telecentric orientation for impingement on the target. Therefore, it is seen that the subfield deflection between points 42 and 43 in the back focal plane of the collimator lens 13 results in a subfield range preferably on the order of tens of microns, as shown at 45. This subfield range is designed to achieve maximum possible speed and avoid any requirement for dynamic corrections at this level of the deflection hierarchy. Any dynamic corrections would be difficult to achieve at a speed consistent with the speed available from electrostatic deflection.

This second type of lens assisted deflection also avoids the need for a second subfield deflector to maintain telecentricity. Perhaps more importantly, however, since the collimated beam crosses the axis 24 of the electron optical system at the back focal plane 28 of the projection lens 11, no correction of the VAIL lens axis is required for the subfield deflection. This will also be true when the subfield deflection is superimposed on cluster and/or field deflection. The subfield deflected beam will always traverse the projection lens at the corrected axis corresponding to the cluster and/or field deflections.

This second form of LAD, where the beam is made to cross the axis 34 of the electron optical column at the back focal plane 28 of the projection lens 11, could theoretically be used for the minor deflection or for the second stage of a two-stage deflection hierarchy (e.g. where the major or field deflection stage is omitted), as well, by placing the minor deflector at a different location than the back focal plane of the collimating lens. Such an arrangement would eliminate the need to provide a minor correction yoke 17 in the VAIL lens. In the particular design of the preferred embodiment, however, such an arrangement was not deemed suitable. However, for a different set of design requirements, the second form of LAD and the omission of the minor correction yoke and driver circuit may be desirable.

Conversely, the first form of LAD as used for cluster deflection, described above, could theoretically be used for the subfield deflection but no advantages are seen for such a design and additional structure including a paired deflector and an additional VAIL correction yoke would be required.

It is especially important to note in regard to the high speed available from the electrostatic deflection, that lens assisted deflection, described above, uses a static optical element (e.g. the collimator lens) as a deflector. Also, if the second form of LAD is used, the projection lens also acts as a static element. In this sense, the operation of the projection lens to return the beam to telecentric orientation is also a static deflection operation in the same sense that the collimator lens is a static deflector. Besides eliminating the need for a second deflector which requires substantial space in the electron optical column, including spacing from the first deflector at each level of the deflection hierarchy and a corresponding deflector drive which can introduce noise, a static element imposes no speed restrictions on the deflection system. Furthermore, the static collimator lens provides LAD for both the cluster and subfield deflections even though the types of LAD may be different.

Figure 5:
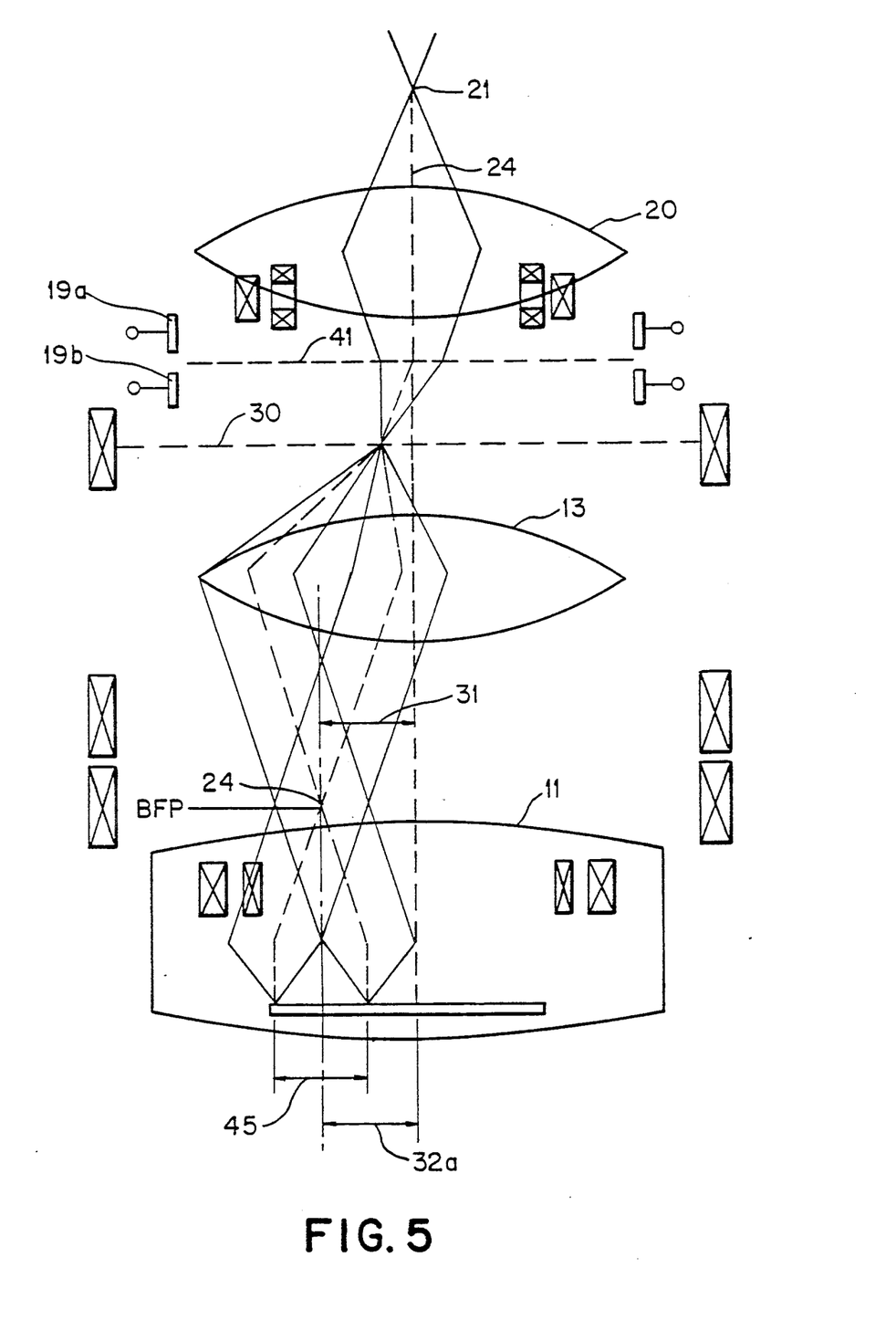
FIG. 5 is a diagram of the electron optical deflection system of FIG. 1 showing simultaneous deflection caused by the combination of the minor and subfield deflectors, in accordance with the invention.

An additional enhancement to the accuracy of the overall deflection system may be achieved by splitting a deflector (e.g. either the minor deflector or the subfield deflector) in half and driving each half with a different drive. FIG. 5 illustrates a split subfield deflector which can be used in accordance with this feature of the invention. The cluster and/or field deflectors can be split in a similar fashion. Other fractional divisions of any particular deflector and drive is also possible. Since the drives are independent, noise in each of the drives for respective portions of the deflector will be uncorrelated and, because of the way the deflector portions are imaged at the target, an attenuation of the noise is realized without any loss of deflection performance or speed. On the contrary, since each drive sees only a portion of the load, additional positioning speed can be obtained. This technique can be applied to any level or combination of levels of the deflection hierarchy.

Further, there are two adjustments necessary for each deflector which can be facilitated by the provision of split deflectors 19a, 19b. The first is called radial telecentricity which is the beam angle relative to the electron optical axis 34 in the plane of the electron optical axis and the direction of deflection. The second is called azimuthal telecentricity which is the beam angle in or projected on the plane of the electron optical axis 34 but perpendicular to the direction of deflection. With split deflectors, the radial orientation of one of the deflector portions with respect to the other portion or portions provides an independent adjustment of azimuthal telecentricity. Radial telecentricity may be adjusted in different ways for each level of deflection. For the major magnetic deflection, radial telecentricity may be adjusted by adjusting the relative current levels of drives for each of coils 12 in the major deflection yoke. The radial telecentricity of the minor magnetic deflector 18 is adjusted by adjusting the collimator lens. Because the subfield deflector 19, in combination with the collimator lens, produces a beam path which crosses the electron optical axis 24 of the system at a position determined by the major and minor deflections at the back focal plane of the projection lens, the projection lens is imaged at infinity. Therefore, the radial telecentricity for the subfield deflector can be adjusted by adjusting the position of the subfield deflectors 19a, 19b. If the subfield deflectors are divided, as discussed above for reduction of noise, into sections at different locations along the electron optical axis, a fine adjustment of radial telecentricity can be achieve by adjusting the relative gains of the respective drivers. In the preferred embodiment of this invention, described above, this fine adjustment has been found to be unnecessary. However, the adjustment is, nevertheless, available if needed in other electron optical designs incorporating the invention.

Referring now to FIG. 5, subfield deflection and cluster deflection are shown superimposed. These two deflections could be superimposed in a like manner on field deflection as additionally shown in FIG. 2. Conversely, it is clear that a substantial range is available from only the subfield and cluster deflectors and FIG. 5 is also representative of the operation of an embodiment of the invention having only two deflection stages (e.g. where the field deflector is omitted) The electron beam from the demagnified spot image 21 is imaged in the back focal plane 30 of the collimator lens by the transfer lens. The divided subfield deflector deflects this image to a particular point within this plane in the identical manner as the unitary subfield deflector illustrated in FIG. 4. Since the beam transfer lens forms an image at a point in the back focal plane of the collimator lens and the focal length of the transfer lens or its functional equivalent can be freely chosen, space is provided whereby the virtual deflection center of the cluster deflector can be made coincident with this plane and the subfield deflector can be placed in advance of this plane. The collimator lens then performs LAD with respect to each component of the subfield and cluster deflection so that the beam traces are, while not parallel to the electron optical axis of the system, symmetrical about a shifted axis of the VAIL lens corresponding to the cluster deflection. The resulting portion of the cluster deflection range 32a and the subfield deflection range 45 are shown in superimposed form.

It should be noted from FIG. 5 that the particular locations of the various elements are shown, as elsewhere in the foregoing description, in locations corresponding to the preferred embodiment of the invention which is directed to application of the invention to an electron beam lithography apparatus to obtain improved speed, accuracy and throughput. In this particular case, the spacing of the collimator lens means from the projection lens means (both being referred to here as "means" since they need not be unitary electron optical elements) should be sufficient to avoid interaction with the major deflection yokes 12. The major deflection yokes 12 should be preferably positioned such that the second of the telecentric deflection yokes is no closer to the projection lens 11 than a point at which the field overlap of the field deflection field and the projection lens field is such that the aberration and telecentricity requirements of the design are met. It is also possible, particularly in connection with the mutual inductance correcting arrangement of U.S. patent application Ser. No. 607,196, filed Oct. 31, 1990, incorporated by reference, above, to place the major deflection coils above the collimator lens and even positionally coincident with the minor deflection coils 18. In this case, lens assisted deflection would also be used to allow use of only a single field deflection yoke; telecentricity of the deflection being, in such a case, maintained by the collimator lens. In this case, telecentricity of the deflection for all of the field, cluster and subfield deflections would occur as depicted in FIG. 5. It is also possible, if large range is not required, to omit the field deflector altogether. These alternative embodiments would have the advantage of allowing close placement of the collimation and projection lenses to minimize effects of aberrations caused by the collimator lens which would otherwise increase with the length of the electron optical axis 24 and distance of the collimator lens 13 from the target plane 15.

The spacing of the telecentric major deflection yokes is not critical to the practice of the invention and is determined by the range desired and the size of the VAIL lens. The spacing of the transfer lens means and the collimator lens means is determined by the respective focal lengths thereof but must provide space for the cluster and subfield deflectors. As indicated above, the focal length of the collimator lens may be altered to maintain telecentricity for the chosen spacing of the cluster deflector and the collimator lens. It has been found preferable to place the cluster deflector at the back focal plane of the collimator lens and to space the subfield deflector at a position which will achieve axial traversal of the back focal plane of the projection lens by the beam. It is also desirable to provide a sufficient distance between the subfield deflector and the collimator lens such that the desired subfield range can be obtained with a sufficiently small deflection angle to avoid aberration. The position and focal length of the transfer lens are determined by the amount of axial length available between the back focal plane of the collimator lens and the apparatus employed for producing the demagnified spot image. It should be understood that other applications of the invention or other design considerations may make other orders and placements of the particular optical elements more desirable than those of the preferred embodiment of the inventions and variations thereof, particularly involving the placement of the cluster and subfield deflectors, also fall within the scope of the present invention.

In view of the foregoing, it is seen that the present invention provides a charged particle beam deflection arrangement which is capable of extremely high speed and minimizes requirements for dynamic correction to achieve high linearity and positioning accuracy at extremely low aberration levels while maintaining telecentricity of all levels of any deflection hierarchy utilized. The system can also be made relatively noise insensitive by providing one or more split deflectors which are also useful in providing increased speed and adjustment of radial and azimuthal telecentricity. The use of a transfer lens allows the cluster and subfield deflectors to be optimally placed to exploit different forms of lens assisted deflection (LAD) to obtain telecentricity at all levels of the deflection hierarchy. In addition, the subfield and minor deflectors can be placed so as to minimize the deflection angles for a given range, thus minimizing deflection aberrations. The subfield and cluster deflectors can also be spaced sufficiently to avoid problems of eddy currents in the plates of an electrostatic subfield deflection stage. The use of such lens assisted deflection allows the electron optical system and drivers therefor to be minimized in number and enables noise to be reduced and adjustments of telecentricity to be made without increase of complexity over the prior art. Also, since the preferred embodiment employs a major/minor magnetic deflection arrangement for the two largest range sections of the deflection hierarchy, correction of inductive coupling between these two deflection arrangements can be optimally implemented according to the arrangement disclosed in copending U.S. patent application Ser. No. 607,196, filed Oct. 31, 1990, incorporated by reference above. By employing the deflection arrangement of the present invention in electron beam lithography apparatus, the throughput and accuracy of such apparatus can be greatly improved.

While the invention has been described in terms of a single preferred embodiment, those skilled in the art will recognize that the invention can be practiced with modification within the spirit and scope of the appended claims.

Having thus described my invention, what I claim as new and desire to secure by Letter Patent is as follows:

1. A charged particle beam deflection apparatus including
   a transfer lens means for imaging a demagnified spot image at a predetermined plane,
   a collimator lens having a back focal plane coincident with said predetermined plane, and
   at least one deflector means having a virtual deflection center located between said back focal plane of said collimator lens and said transfer lens means.

2. A charged particle beam deflection apparatus as recited in claim 1, further including an additional deflector means located at said back focal plane of said collimator lens.

3. A charged particle beam defection apparatus as recited in claim 2, further including a projection lens having a back focal plane wherein said additional deflector means is located in relation to said collimator lens at a point which is conjugate to said back focal plane of said projection lens.

4. A charged particle beam deflection apparatus as recited in claim 3, including a further deflection means located between said collimator lens and said projection lens.

5. A charged particle beam deflection apparatus as recited in claim 1, further including a projection lens having a back focal plane wherein said at least one deflector means is located in relation to said collimator lens at a point which is conjugate to said back focal plane of said projection lens.

6. A charged particle beam deflection apparatus as recited in claim 5, including a further deflection means located between said collimator lens and said projection means.

7. A charged particle beam deflection apparatus as recited in claim 1, wherein said at least one deflector means is formed as a plurality of partial deflector means, said partial deflector means being individually positionable with respect to each other and with respect to an electron optical axis of said charged particle beam deflection apparatus.

8. A charged particle beam deflection apparatus as recited in claim 7, wherein at least two of said partial deflector means each include separate driver means and said at least two partial deflector means are independently driven by said separate partial driver means.

9. A charged particle beam deflection apparatus having a first lens means for imaging a demagnified spot image at a predetermined plane and at least one second lens means wherein said first lens means includes means for at least focussing an image formed by said at least one second lens means.

10. A charged particle beam deflection apparatus as recited in claim 9, wherein said first lens means includes means for correcting astigmatism in the image formed by said second lens means.

11. A method of deflecting a charged particle in a charged particle deflection apparatus having a collimator lens means, a projection lens means and at least one deflector means, including the step of deflecting a path of a charged particle by static operation of at least one of said collimator lens means and said projection lens means.

12. A method as recited in claim 11, including the further step of deflecting said charged particle by said at least one deflector means and wherein said step of deflecting said charged particle by static operation of at least one of said collimator lens means and said projection lens means produces a deflection which is substantially complementary to a deflection produced by said further step of deflecting said charged particle.

13. A method as recited in claim 12, including the further step of adjusting said collimator lens means to return said path of said charged particle to telecentric orientation after said deflection of said charged particle by said further step of deflecting said path of said charged particle.

14. A method as recited in claim 12, wherein said projection lens has a variable axis and wherein said collimator lens means deflects said path of said charged particle to traverse a back focal plane of said projection lens means at the location of said variable axis and said projection lens returns said path of said charged particle to telecentric orientation after said deflection of said charged particle by said further step of deflecting said path of said charged particle.

15. An electron beam lithography apparatus including
   a transfer lens means for imaging a demagnified spot image at a predetermined plane,
   a collimator lens having a back focal plane coincident with said predetermined plane, and
   at least one deflector means having a virtual deflection center located between said back focal plane of collimator lens and said transfer leans means.

16. An electron beam lithography apparatus as recited in claim 15, further including an additional deflector means located at said back focal plane of said collimator lens.

17. An electron beam lithography apparatus as recited in claim 16, further including a projection lens having a back focal plane wherein said additional deflector means is located in relation to said collimator lens at a point which is conjugate to said back focal plane of said projection lens.

18. An electron beam lithography apparatus as recited in claim 17, including a further deflection means located between said collimator lens and said projection lens.

19. An electron beam lithography apparatus as recited in claim 17, including a further deflection means located between said collimator lens and said projection means.

20. An electron beam lithography apparatus as recited in claim 15, further including a projection lens having a back focal plane wherein said at least one deflector means is located in relation to said collimator lens at a point which is conjugate to said back focal plane of said projection lens.

21. A electron beam lithography apparatus as recited in claim 20, including a further deflection means located between said collimator lens and said projection means.

22. An electron beam lithography apparatus as recited in claim 15, wherein said at least one deflector means is formed as a plurality of partial deflector means, said partial deflector means being individually positionable with respect to each other and with respect to an electron optical axis of said charged particle beam deflection apparatus.

23. An electron beam lithography apparatus as recited in claim 22, wherein at least two of said partial deflector means each include separate driver means and said at least two partial deflector means are independently driven by said separate partial driver means.

24. A charged particle beam deflection apparatus including
- a transfer lens means for imaging a demagnified spot image at a predetermined plane,
- a collimator lens having a back focal plane coincident with said predetermined plane,
- at least one deflector means having a virtual deflection center located between said collimator lens and said transfer lens means, and
- a projection lens having a back focal plane wherein said at least one deflector means is located in relation to said collimator lens at a point which is conjugate to said back focal plane of said projection lens.

25. A charged particle beam deflection apparatus as recited in claim 24, including a further deflection means located between said collimator lens and said projection means.

26. A charged particle beam deflection apparatus including
- a transfer lens means for imaging a demagnified spot image at a predetermined plane,
- a collimator lens having a back focal plane coincident with said predetermined plane,
- at least one deflector means having a virtual deflection center located at said back focal plane of said collimator lens, and
- a projection lens having a back focal plane and an additional deflector means wherein said additional deflector means is located in relation to said collimator lens at a point which is conjugate to said back focal plane of said projection lens.

27. A charged particle beam deflection apparatus as recited in claim 26, including a further deflection means located between said collimator lens and said projection lens.

28. An electron beam lithography apparatus including
- a transfer lens means for imaging a demagnified spot image at a predetermined plane,
- a collimator lens having a back focal plane coincident with said predetermined plane,
- at least one deflector means having a virtual deflection center located between said collimator lens and said transfer lens means, and
- a projection leans having a back focal plane wherein said at least one deflector means is located in relation to said collimator lens at a point which is conjugate to said back focal plane of said projection lens.

29. A electron beam lithography apparatus as recited in claim 28, including a further deflection means located between said collimator lens and said projection lens.

30. An electron beam lithography apparatus including
- a transfer lens means for imaging a demagnified spot image at a predetermined plane,
- a collimator lens having a back focal plane coincident with said predetermined plane,
- at least one deflector means having a virtual deflection center located at said back focal plane of said collimator lens, and
- a projection lens having a back focal plane and an additional deflector means wherein said additional deflector means is located in relation to said collimator lens at a point which is conjugate to said back focal plane of said projection lens.

* * * * *